(12) United States Patent
Takabayashi et al.

(10) Patent No.: US 10,530,119 B2
(45) Date of Patent: Jan. 7, 2020

(54) WAVELENGTH LOCKER, WAVELENGTH TUNABLE LASER APPARATUS, AND METHOD FOR CONTROLLING WAVELENGTH TUNABLE LASER APPARATUS

(71) Applicant: FUJITSU LIMITED, Kawasaki-shi, Kanagawa (JP)

(72) Inventors: Kazumasa Takabayashi, Atsugi (JP); Suguru Akiyama, Tsukuba (JP)

(73) Assignee: FUJITSU LIMITED, Kawasaki (JP)

( * ) Notice: Subject to any disclaimer, the term of this patent is extended or adjusted under 35 U.S.C. 154(b) by 17 days.

(21) Appl. No.: 16/050,427

(22) Filed: Jul. 31, 2018

(65) Prior Publication Data
US 2019/0044300 A1 Feb. 7, 2019

(30) Foreign Application Priority Data
Aug. 7, 2017 (JP) .................. 2017-152663

(51) Int. Cl.
*H01S 3/13* (2006.01)
*G02B 6/293* (2006.01)
(Continued)

(52) U.S. Cl.
CPC .......... *H01S 3/1305* (2013.01); *H01S 5/0687* (2013.01); *G02B 6/2935* (2013.01); *H04B 10/503* (2013.01)

(58) Field of Classification Search
CPC . H01S 3/0078; H01S 3/10; H01S 3/13; H01S 3/1303; H01S 3/1305;
(Continued)

(56) References Cited

U.S. PATENT DOCUMENTS 4,847,851 A * 7/1989 Dixon ..................... H01S 3/042
372/75
6,137,812 A * 10/2000 Hsu .......................... H01S 3/067
372/6
(Continued)

FOREIGN PATENT DOCUMENTS

| JP | 2003-60293 A | 2/2003 |
| JP | 2005-32968 A | 2/2005 |
| JP | 2005-340359 A | 12/2005 |

*Primary Examiner* — Xinning(Tom) Niu
*Assistant Examiner* — Sean P Hagan
(74) *Attorney, Agent, or Firm* — Fujitsu Patent Center (57) ABSTRACT

A wavelength locker includes a splitter configured to split a portion of light that is output from a light source into a first monitoring light and a second monitoring light; a first periodic filter configured to receive the first monitoring light; a second periodic filter configured to receive the second monitoring light; a first optical receiver configured to monitor an intensity of light that has passed through the first periodic filter; and a second optical receiver configured to monitor an intensity of light that has passed through the second periodic filter, wherein the first periodic filter and the second periodic filter each has a wavelength characteristic in which an intensity of transmitted light changes periodically with respect to a wavelength, and the wavelength characteristic of the first periodic filter and the wavelength characteristic of the second periodic filter shift in opposite wavelength directions when temperature changes.

11 Claims, 9 Drawing Sheets

(51) Int. Cl.
*H01S 5/0687* (2006.01)
*H04B 10/50* (2013.01)

(58) Field of Classification Search
CPC . H01S 5/0078; H01S 5/0687; G01B 9/02008; G01B 9/02056
See application file for complete search history.

(56) References Cited

U.S. PATENT DOCUMENTS

| | | | |
|---|---|---|---|
| 6,501,776 B1 * | 12/2002 | Numai | H01S 5/068 372/45.01 |
| 2002/0186729 A1 | 12/2002 | Nasu et al. | |
| 2004/0165623 A1 * | 8/2004 | Imaki | G01J 4/04 372/32 |
| 2005/0265402 A1 | 12/2005 | Tanaka et al. | |

* cited by examiner

111(or 121)
OPTICAL PATH LENGTH=Lcom

113(or 123)     114(or 124)

112(or 122)
OPTICAL PATH LENGTH=Lcom+$\Delta L0$

WAVELENGTH LOCKER, WAVELENGTH TUNABLE LASER APPARATUS, AND METHOD FOR CONTROLLING WAVELENGTH TUNABLE LASER APPARATUS

CROSS-REFERENCE TO RELATED APPLICATION

This application is based upon and claims the benefit of priority of the prior Japanese Patent Application No. 2017-152663, filed on Aug. 7, 2017, the entire contents of which are incorporated herein by reference.

FIELD

The embodiment discussed herein is related to a wavelength locker, a wavelength tunable laser apparatus, and a method for controlling the wavelength tunable laser apparatus.

BACKGROUND

Wavelength tunable lasers are widely used as light sources in optical communication systems using wavelength division multiplexing. In a wavelength tunable laser, a wavelength locker is used to control the lasing wavelength precisely. In a typical wavelength locker, light split from the output light of a wavelength tunable laser is allowed to pass through a wavelength filter that has periodic transmission peaks, such as an etalon filter, and the intensity of the transmitted light is monitored. The wavelength is controlled via feedback so that the monitored value coincides with the intensity of the transmitted light of the etalon at a target wavelength.

In a wavelength locker, when the temperature of a wavelength filter (etalon in the above example) that has a periodic transmission characteristic changes, the transmission characteristic of the filter shifts with respect to the wavelength without changing the shape of the transmission characteristic. Thus, if the wavelength is controlled so that the monitored value of the intensity of the transmitted light coincides with a desired value, the wavelength of the light source shifts from the target wavelength in accordance with an amount of shift of the transmission characteristics of the filter caused by the temperature change, and this shift is a problem.

A wavelength monitor that is used in an optical transmission module and configured to include a first wavelength measuring unit and a second wavelength measuring unit has been proposed (for example, refer to Japanese Laid-open Patent Publication No. 2005-32968). In this wavelength monitor, the ratio of an amount of change in the transmittance with respect to a wavelength change to an amount of change in the transmittance with respect to a change in the external environment temperature differs between the first wavelength measuring unit and the second wavelength measuring unit.

In this method of the related art, the lasing wavelength of a laser is stabilized by controlling the optical transmission module so that the ratio of $\Delta Ipd1$ to $\Delta Ipd2$ coincides at all times with the ratio of a temperature variation coefficient of the etalon filter in the first wavelength measuring unit to a temperature variation coefficient of the etalon filter in the second wavelength measuring unit, where $\Delta Ipd1$ and $\Delta Ipd2$ are amounts of monitor current shift from a target value at a reference temperature, which are measured by the first wavelength measuring unit and by the second wavelength measuring unit, respectively. This leads to complex control processing. An unexpected temperature difference between the two etalon filters having different temperature characteristics may be caused, and thus it is difficult to extract only an effect of the difference between the temperature characteristics of the two periodic filters. In view of the foregoing discussion, a wavelength filter to control a shift in the wavelength of a light source preferably detects the wavelength of the light source irrespective of the ambient temperature change.

SUMMARY

According to an aspect of the invention, a wavelength locker includes a splitter configured to split a portion of light that is output from a light source into a first monitoring light and a second monitoring light; a first periodic filter configured to receive the first monitoring light; a second periodic filter configured to receive the second monitoring light; a first optical receiver configured to monitor an intensity of light that has passed through the first periodic filter; and a second optical receiver configured to monitor an intensity of tight that has passed through the second periodic filter, wherein the first periodic filter and the second periodic filter each have a wavelength characteristic in which an intensity of transmitted light changes periodically with respect to a wavelength, and the wavelength characteristic of the first periodic filter and the wavelength characteristic of the second periodic filter shift in opposite wavelength directions when temperature changes.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

In an embodiment, a first filter and a second filter each having a periodic transmission characteristic with respect to the wavelength are designed so that a wavelength characteristic of the first filter and a wavelength characteristic of the second filter shift in opposite wavelength directions when the temperature changes. In the following descriptions, a filter having a periodic transmission characteristic in the wavelength region is called a "periodic filter". In one of the cases where the wavelength of a light source shifts from a target wavelength and where the temperature of the periodic filters shifts, the monitored values of the transmitted light that is output from the first and second periodic filters both increase or decrease, and, in the other of the cases, one of the monitored values of the transmitted light that is output from the first and second periodic filters increases, and the other of the monitored values decreases.

For example, the filters are designed so that when both of the monitored values of the transmitted light that is output from the first periodic filter and from the second periodic filter increase (variation in the same direction) in accordance with a temperature shift, the monitored value of the transmitted light that is output from the first periodic filter increases, and the monitored value of the transmitted light that is output from the second periodic filter decreases (variation in opposite directions) in accordance with a wavelength shift. Thus, the shift in the wavelength of the light source from the target wavelength and the temperature shift of the periodic filters are easily detected by using the sum of or difference between the two monitored values. Using the sum and difference enables at least one of the wavelength of the light source and the filter temperature to be controlled independently of the other.

If two filters having a periodic transmission characteristic with respect to the wavelength are monolithically integrated on a single chip, the temperatures of the two filters match relatively easily. In such a case, the difference between the temperature characteristics of the filters is accurately extracted, and wavelength monitoring and temperature monitoring may be performed separately.

Figure 1:
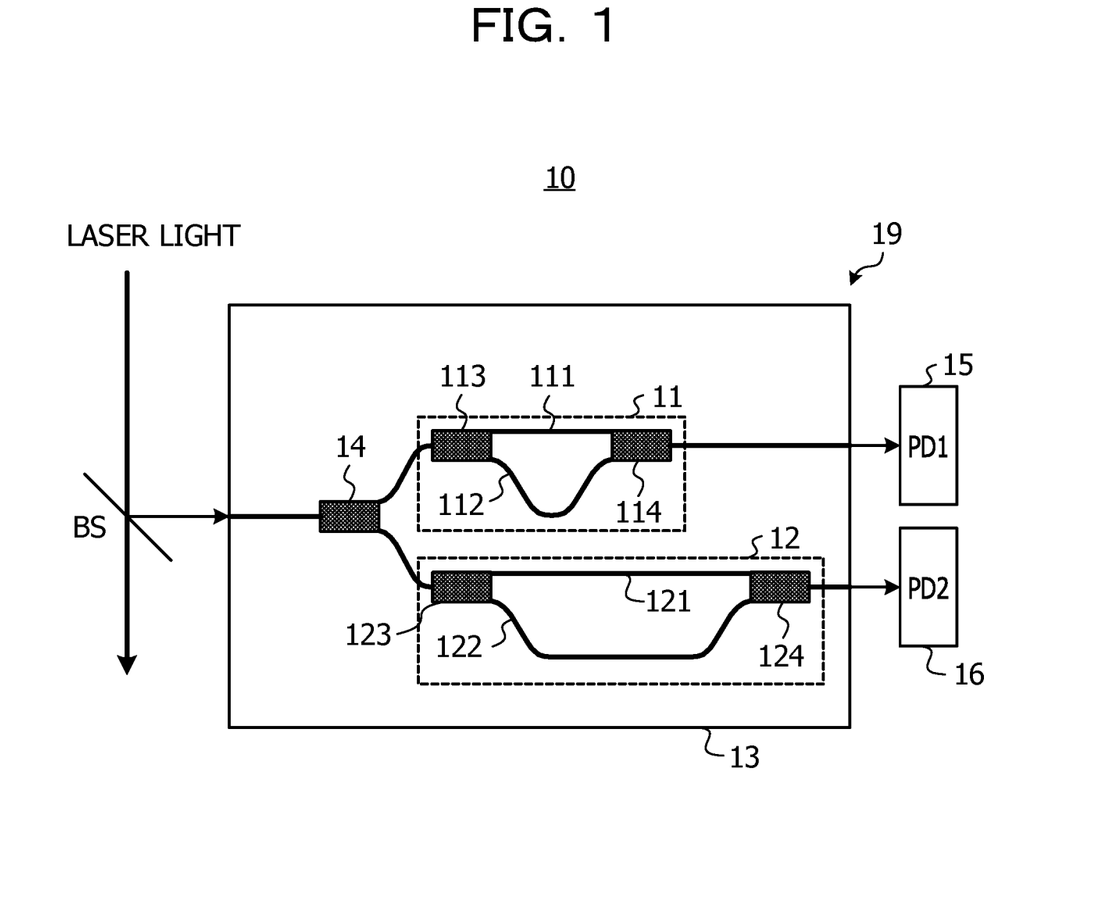
FIG. 1 is a schematic diagram of a wavelength locker according to an embodiment.

FIG. 1 is a schematic diagram of a wavelength locker 10 according to the embodiment. A portion of output light, for example, 10%, from a light source such as a wavelength tunable laser is split by using a beam splitter (BS) and guided to two filters having a periodic transmission characteristic. The two filters are called a first periodic filter 11 and a second periodic filter 12. A filter having a periodic transmission characteristic is a filter having a wavelength characteristic in which the intensity of the output light from the filter changes periodically with respect to the wavelength. In the example in FIG. 1, the first periodic filter 11 and the second periodic filter 12 are waveguide-type periodic filters monolithically formed on the same substrate 13. These filters are formed as a filter-integrated element 19 for a wavelength locker.

Light split by a BS is further split by an optical branch waveguide 14 formed on the filter-integrated element 19. The branching ratio of the optical branch waveguide 14 is, for example, 1:1. The first periodic filter 11 is connected to one of the branches and the second periodic filter 12 is connected to the other of the branches. Light that has passed through the first periodic filter 11 is output from the filter-integrated element 19 and received by a first optical receiver element 15 (photodiode PD1), and the light intensity is monitored. Light that has passed through the second periodic filter 12 is output from the filter-integrated element 19 and received by a second optical receiver element 16 (photodiode PD2), and the light intensity is monitored.

For example, a 1×2 multimode interferometric waveguide or a directional coupling waveguide whose coupling length is adjusted to provide a branching ratio of 1:1 may be used as the optical branch waveguide 14. The optical branch waveguide 14 further splits the light split by the BS into a first monitoring light and a second monitoring light and guides the first monitoring light and the second monitoring light to the first periodic filter 11 and the second periodic filter 12, respectively.

The first periodic filter 11 is constituted by an asymmetric Mach-Zehnder (MZ) interferometer that includes a first waveguide 111 and a second waveguide 112 that have different lengths. The first waveguide 111 and the second waveguide 112 extend from a 1×2 input-side optical coupler 113 to a 2×1 output-side optical coupler 114.

The second periodic filter 12 is constituted by an asymmetric MZ interferometer that includes a third waveguide 121 and a fourth waveguide 122 that have different lengths. The third waveguide 121 and the fourth waveguide 122 extend from a 1×2 input-side optical coupler 123 to a 2×1 output-side optical coupler 124.

A feature of the embodiment is that a peak wavelength in the wavelength characteristic of the first periodic filter 11 and a peak wavelength in the wavelength characteristic of the second periodic filter 12 shift in opposite wavelength directions when the temperature changes. This feature of the embodiment makes it possible to control a lasing wavelength of a wavelength tunable laser and/or the temperature of the first periodic filter 11 and the second periodic filter 12 by using the sum of or the difference between the monitored values of the first optical receiver element 15 and the second optical receiver element 16. Details on the control will be described later.

Figure 2A:
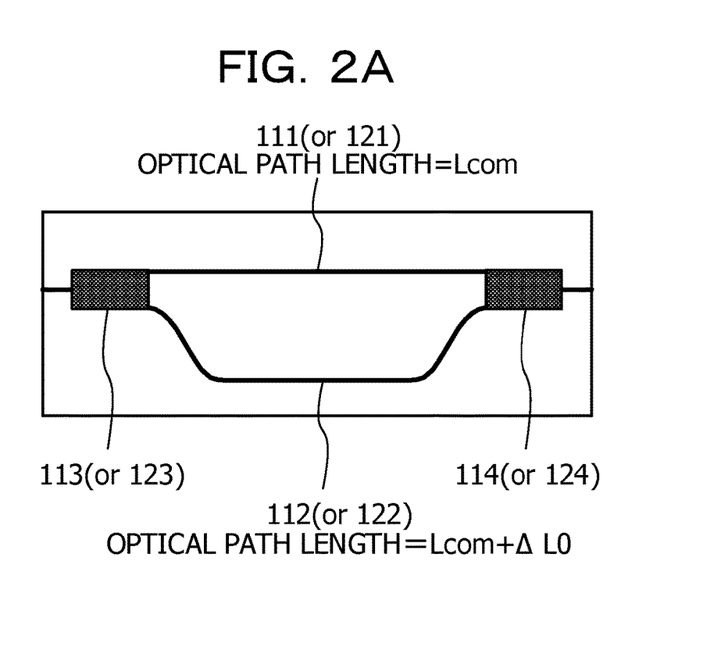
FIGS. 2A, 2B, and 2C are diagrams depicting an example configuration of a waveguide-type filter according to the embodiment.
Figure 2B:
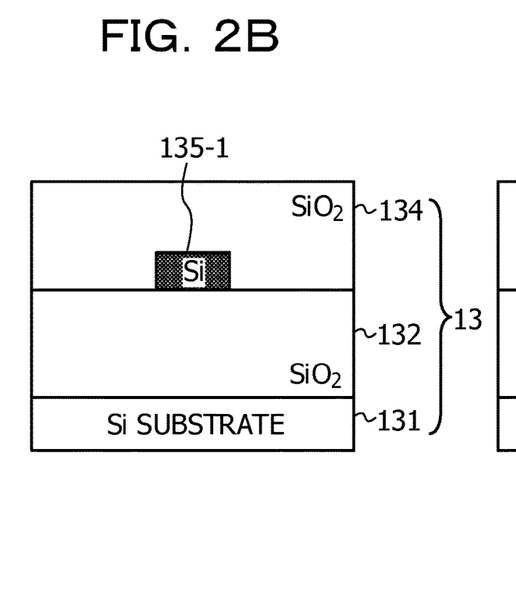
Figure 2C:
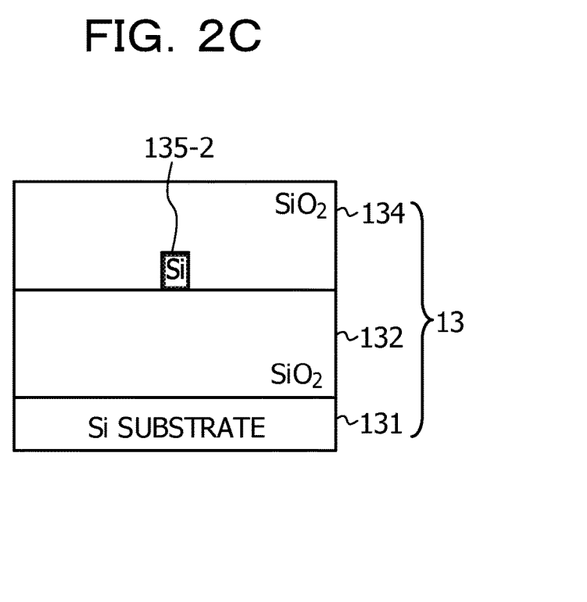

FIGS. 2A, 2B, and 2C are illustrations describing a configuration of the first periodic filter 11 and the second periodic filter 12. Referring to FIG. 2A, the shorter waveguide of the first periodic filter 11 is referred to as the first waveguide 111, and the longer waveguide is referred to as the second waveguide 112. The shorter waveguide of the second periodic filter 12 is referred to as the third waveguide 121, and the longer waveguide is referred to as the fourth waveguide 122.

The optical path length difference between the first waveguide 111 and the second waveguide 112 is denoted by $\Delta L0$. The length common to the first waveguide 111 and the second waveguide 112, which is a length that does not include the optical path length difference, is denoted by Lcom. The length of the shorter waveguide, which is the first waveguide 111, is Lcom, and the length of the longer waveguide, which is the second waveguide 112, is Lcom+$\Delta L0$.

Similarly, the optical path length difference between the third waveguide 121 and the fourth waveguide 122 is denoted by $\Delta L0$, and the length common to the third waveguide 121 and the fourth waveguide 122, which is a length that does not include the optical path length difference, is denoted by L'com. The length of the shorter waveguide, which is the third waveguide 121, is L'com, and the length of the longer waveguide, which is the fourth waveguide 122, is L'com+$\Delta L0$. Although FIG. 2A is drawn with a focus on the first periodic filter 11, the relation between the two waveguides in the first periodic filter 11 is the same as the relation between the two waveguides in the second periodic filter 12.

The optical path length difference ΔL0 of the first periodic filter 11 and the optical path length difference ΔL0 of the second periodic filter 12 are set to the same value, for example, 3 mm. The period of the change in the transmittance with respect to a wavelength change of an asymmetric MZ interferometer, (hereinafter, the change is simply called a "wavelength characteristic") depends on the optical path length difference, and thus a suitably set ΔL0 provides a desired period. If a ΔL0 is set to 3 mm, the period of the wavelength characteristics is approximately 0.8 nm (approximately 100 GHz in frequency).

A peak wavelength in the wavelength characteristic of the first periodic filter 11 and a peak wavelength in the wavelength characteristic of the second periodic filter 12 shift in opposite directions when the temperature changes. The first periodic filter 11 is designed so that the peak wavelength shifts toward longer wavelengths as the temperature rises, and the second periodic filter 12 is designed so that the peak wavelength shifts toward shorter wavelengths as the temperature rises. A configuration of the waveguide-type periodic filter that has such an inverse temperature characteristic will be described in more detail.

As depicted in FIGS. 2B and 2C, the first waveguide 111 and the second waveguide 112 are designed so that a change in the equivalent refractive index with respect to a temperature change of the waveguide differs between the first waveguide 111 and the second waveguide 112. The second waveguide 112 has a waveguide cross section with a refractive index that has a smaller rate of change with respect to a temperature change compared with the first waveguide 111. A change in the equivalent refractive index with respect to a temperature change of the waveguide differs between the third waveguide 121 and the fourth waveguide 122. The fourth waveguide 122 has a waveguide cross section with a refractive index that has a smaller rate of change with respect to a temperature change compared with the third waveguide 121.

Such a feature is realizable, for example, by using a silicon (Si) thin wire as a waveguide, which is constituted by a Si core layer disposed in a SiO$_2$ cladding 134, and making the width of a Si core layer 135-2 of the second waveguide 112 smaller than the width of a Si core layer 135-1 of the first waveguide 111. Similarly, the width of the Si core layer 135-2 of the fourth waveguide 122 is made smaller than the width of the Si core layer 135-1 of the third waveguide 121. The Si core layers 135-1 and 135-2 are formed, for example, by using a silicon-on-insulator (SOI) substrate as a substrate 13 and patterning an upper Si layer by using exposure and development. A SiO$_2$ layer 132 on a Si substrate 131 of the SOI substrate 13 is a buried oxide layer and is used as a lower cladding layer.

A change in the width of the Si core layer varies a rate of change in the refractive index with respect to temperature because a rate of change in the refractive index of Si with respect to temperature is an order of magnitude larger than a rate of change in the refractive index of SiO$_2$. If the width of the Si core layer 135-1 is large and optical confinement is strong, a change in the equivalent refractive index with respect to a temperature change increases. In contrast, if the width of the Si core layer 135-2 is small and optical confinement is weak, a change in the equivalent refractive index with respect to a temperature change decreases.

In an example configuration depicted in FIGS. 2A, 2B, and 2C, the rate of change in the refractive index with respect to temperature is set to +0.0042%/° C. for the first waveguide 111, and the rate of change in the refractive index with respect to temperature is set to +0.0026%/° C. for the second waveguide 112. The third waveguide 121 has the same optical confinement structure as the first waveguide 111, and thus the rate of change in the refractive index with respect to temperature for the third waveguide 121 is the same as the rate of change in the refractive index with respect to temperature for the first waveguide 111. The fourth waveguide 122 has the same optical confinement structure as the second waveguide 112, and thus the rate of change in the refractive index with respect to temperature for the fourth waveguide 122 is the same as the rate of change in the refractive index with respect to temperature for the second waveguide 112. The first periodic filter 11 and the second periodic filter 12 of the asymmetric MZ interferometer type are each constituted by a short waveguide having a large rate of change in the refractive index with respect to temperature and a long waveguide having a small rate of change in the refractive index with respect to temperature.

In this example, Si thin wire waveguides that have different degrees of optical confinement are used as waveguides having different temperature characteristics. The waveguides are not limited to this example, and any two waveguides that differ in terms of temperature dependence of the change in the refractive index may be used. For example, a material from which a waveguide is formed may be a semiconductor compound or a material related to quartz. Two kinds of materials that have different temperature characteristics may be used to form two waveguides, respectively, to obtain different temperature characteristics for the two waveguides.

To obtain a different degree of optical confinement for each of the two Si thin wire waveguides that constitute an asymmetric MZ interferometer, configurations such as Si core layers that have different heights and Si core layers that have different heights and widths may be used. At least one of the height and the width of a core layer is made larger in one of the two waveguides than in the other, thereby increasing optical confinement, and thus the change in the refractive index with respect to a temperature change is increased. Alternatively, the shape of the waveguide that forms a core may be changed for the two waveguides. The first waveguide 111 and the third waveguide 121 may be constituted by a Si core of a rib type, which has a high degree of optical confinement, and the second waveguide 112 and the fourth waveguide 122 may be constituted by a Si core of a thin wire type. Also in such a case, a degree of change in the refractive index with respect to temperature may be changed for the first waveguide 111 and for the second waveguide 112, and for the third waveguide 121 and for the fourth waveguide 122.

Figure 3:
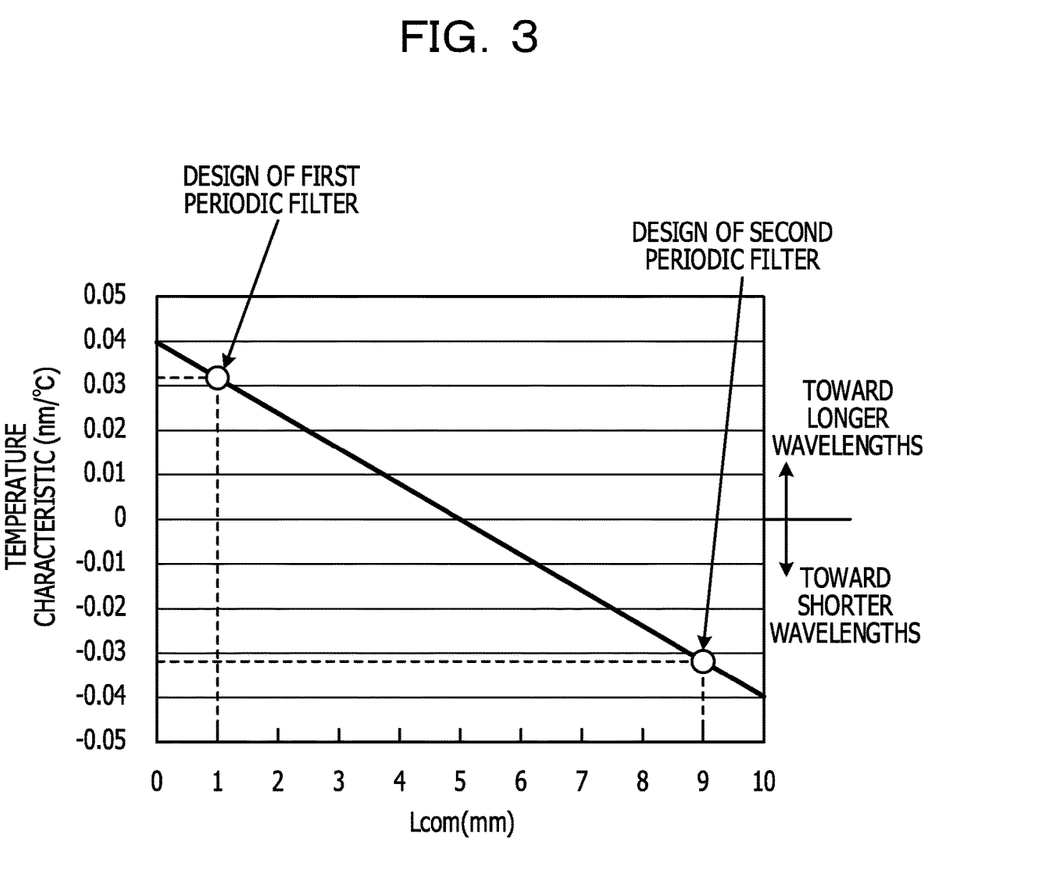
FIG. 3 is a graph depicting a relation between a temperature characteristic and an optical path length of the waveguide-type filter according to the embodiment.

FIG. 3 is a graph depicting a relation between the temperature characteristic and the optical path length of the periodic filter according to the embodiment. FIG. 3 depicts a change in a temperature characteristic (nm/° C.) of an asymmetric MZ interferometer, which has two waveguides with different temperature characteristics, for the varying common optical path length Lcom with the optical path length difference ΔL0 between the two waveguides fixed. The temperature characteristic is represented by an amount of shift of a peak wavelength in the wavelength characteristic of the asymmetric MZ interferometer with respect to a temperature change. A point at Lcom equal to 0 mm on the horizontal axis represents a point where the length of the first waveguide 111 (or the third waveguide 121) is zero.

If the length of the first waveguide 111 (or the third waveguide 121) is zero, the temperature characteristic of the asymmetric MZ interferometer is provided directly by the temperature characteristic of the second waveguide 112 (or the fourth waveguide 122). The rate of change in the equivalent refractive index of the second waveguide 112 (or the fourth waveguide 122) directly generates a change in the wavelength characteristic of 0.0026%/° C. For example, the wavelength shifts toward longer wavelengths at a rate of approximately 0.04 nm/° C. in the wavelength band of 1550 nm, which is typically used for long-haul optical communications. As the lengths of the first waveguide 111 and the second waveguide 112 are both increased, that is, the common optical path length Lcom is increased with the optical path length difference ΔL0 between the first waveguide 111 and the second waveguide 112 fixed, the magnitude of temperature dependence of the asymmetric MZ interferometer decreases. If the common optical path length Lcom exceeds a certain length, a peak wavelength in the wavelength characteristic shifts toward shorter wavelengths as the temperature increases.

In the example in FIG. 3, if the optical path length of the first waveguide 111 is 1 mm and the optical path length of the second waveguide 112 is 4 mm (Lcom=1 mm, ΔL0=3 mm), the amount of shift of the wavelength characteristic caused by the temperature change of the first periodic filter 11 is +0.032 nm/° C. On the other hand, if the optical path length of the third waveguide 121 is 9 mm and the optical path length of the fourth waveguide 122 is 12 mm (Lcom=9 mm, ΔL0=3 mm), the amount of shift of the wavelength characteristic caused by the temperature change of the second periodic filter 12 is –0.032 nm/° C., generating a shift in a negative direction (toward shorter wavelengths). Thus, two periodic filters that have opposite temperature characteristics are realized. A mechanism to obtain the opposite temperature characteristics is described below.

If an effect of the temperature variation is taken into account, the optical path length difference ΔL12 between the first waveguide 111 and the second waveguide 112 is given by Equation 1. The temperature dependence of the optical path length difference ΔL12 determines the temperature dependence of the wavelength characteristic of a waveguide-type periodic filter.

$$\Delta L12 = L2\times(1+\beta\Delta T) - L1\times(1+\alpha\Delta T) \quad \text{(Equation 1)}$$

Here, L1 and L2 represent the optical path lengths of the first waveguide 111 and the second waveguide 112, respectively, at a predetermined temperature, and α and β represent rates of change in the equivalent refractive index with respect to the temperature of the first waveguide 111 and the second waveguide 112, respectively. Both α and β are positive, and α>β. This is because the rate of change in the refractive index with respect to the temperature change of the first waveguide 111 is designed to be larger than the rate of change in the refractive index with respect to the temperature change of the second waveguide 112 as described above. The optical path lengths L1 and L2 are determined so that the difference between L2 and L1 (L2–L1=ΔL0) is fixed in view of setting the filter period of the asymmetric MZ interferometer to a desired value. In this example, ΔL0 is equal to 3 mm. If the first waveguide 111 and the second waveguide 112 are both lengthened, that is, the common optical path length Lcom is increased with the optical path length difference ΔL0 fixed, the optical path length difference ΔL12 between the first waveguide 111 and the second waveguide 112 with the temperature variation taken into account is given by $$\text{(Equation 2)}$$
$$\Delta L12 = (\Delta L0 + Lcom)\times(1+\beta\Delta T) - Lcom\times(1+\alpha\Delta T)$$
$$= \Delta L0 + \{\beta\Delta L - (\alpha-\beta)Lcom\}\Delta T$$
$$= \Delta L0 + C\Delta T,$$

where C is a coefficient representing the change in the optical path length difference of the asymmetric MZ interferometer with respect to the temperature change and is given by $$C=\beta\Delta L-(\alpha-\beta)Lcom \quad \text{(Equation 3)}$$

from Equation 2.

As the first waveguide 111 and the second waveguide 112 are both lengthened, that is, Lcom is increased, the coefficient C decreases, and the change in the optical path length difference with respect to the temperature becomes negative under the condition that $$Lcom>\beta\Delta L/(\alpha-\beta) \quad \text{(Equation 4)}.$$

The wavelength characteristic of the periodic filter 11 constituted by the asymmetric MZ interferometer depends on the change in the optical path length difference ΔL12. The wavelength characteristic of the periodic filter 11 shifts toward longer wavelengths as the optical path length difference ΔL12 increases and shifts toward shorter wavelengths as the optical path length difference ΔL12 decreases. Consequently, by adjusting the common optical path length Lcom as depicted in FIG. 3, the direction of shift in wavelength caused by the temperature change is inverted, and thus the waveguide-type periodic filters 11 and 12 that have opposite temperature characteristics are realized.

Next, a wavelength locker that includes the first periodic filter 11 and the second periodic filter 12 that have opposite temperature characteristics and wavelength control performed by the wavelength locker will be described.

Figure 4A:
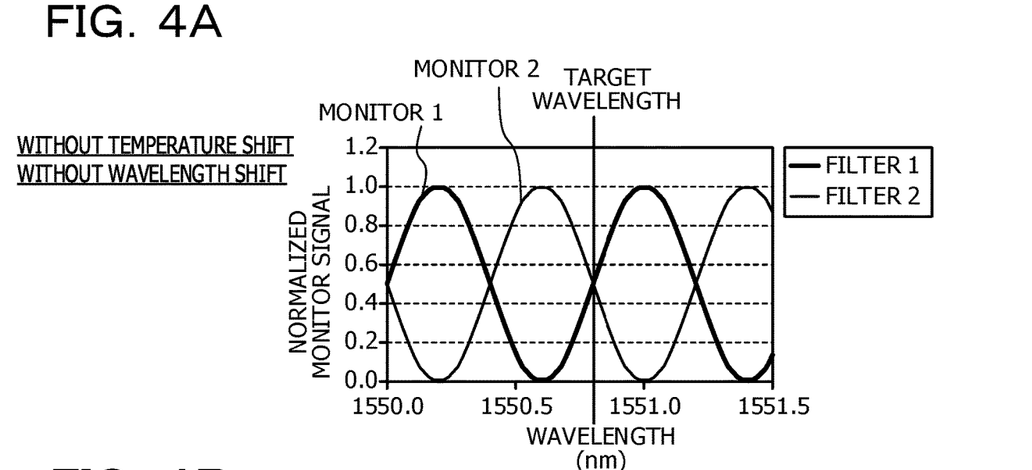
FIGS. 4A, 4B, and 4C are graphs depicting an example of wavelength characteristics and temperature characteristics of the waveguide-type filters according to the embodiment.
Figure 4B:
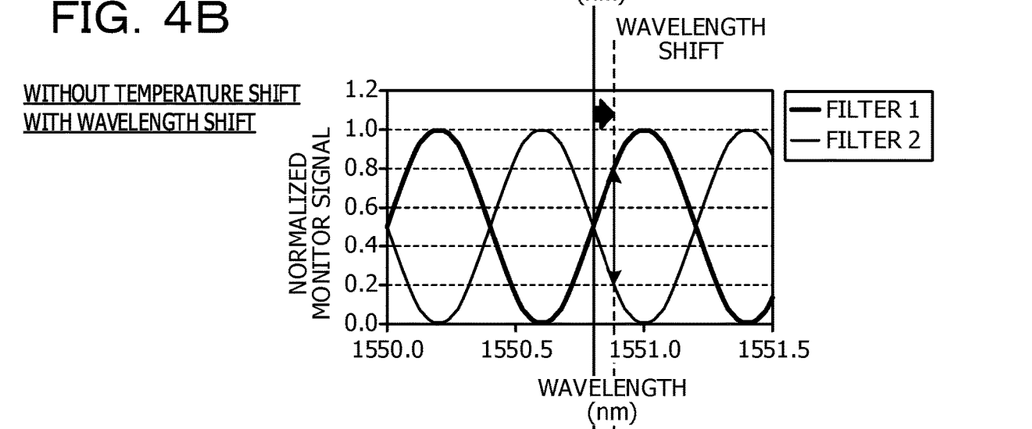
Figure 4C:
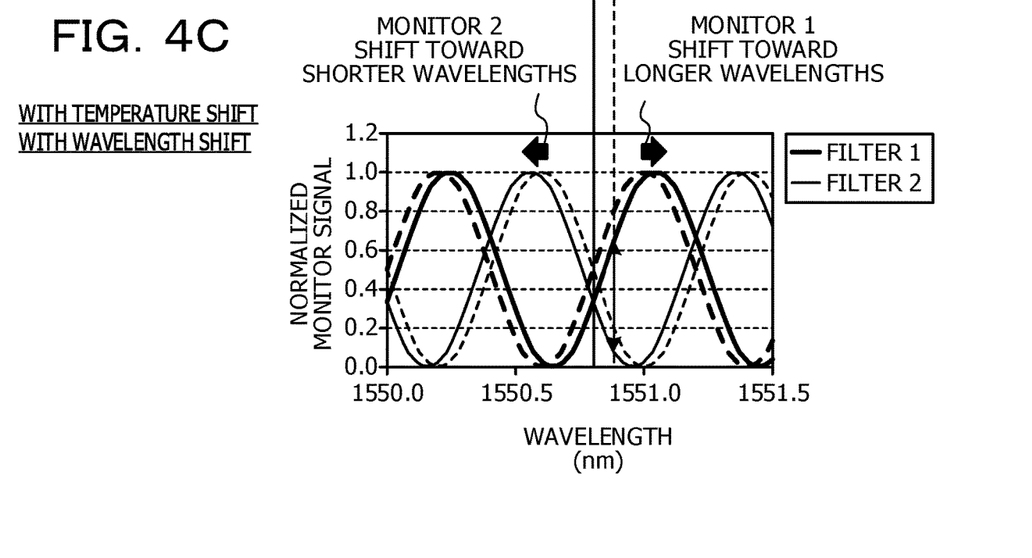

FIGS. 4A, 4B, and 4C depict an example of wavelength characteristics of the first periodic filter 11 and the second periodic filter 12, which are the waveguide-type filters according to the embodiment. In this example, a gradient of the transmittance of the first periodic filter 11 with respect to the wavelength, the transmittance being represented by a thick solid line (sinusoidal curve denoted by "MONITOR 1"), is positive at around the target wavelength of the laser. A gradient of the transmittance of the second periodic filter 12 with respect to the wavelength, the transmittance being represented by a thin solid line (sinusoidal curve denoted by "MONITOR 2"), is negative.

A monitored value of the first optical receiver element 15 (PD1) and a monitored value of the second optical receiver element 16 (PD2) correspond to a transmittance value of the first periodic filter 11 and a transmittance value of the second periodic filter 12, respectively. Thus, the gradient of the monitored value of the first optical receiver element 15 is positive, and the gradient of the monitored value of the second optical receiver element 16 is negative. The filter-integrated element 19 is adjusted so that the wavelength at which the transmittance value of the first periodic filter 11 and the transmittance value of the second periodic filter 12 match each other coincides with the target wavelength at a predetermined temperature as depicted in FIG. 4A. In other words, the filter-integrated element 19 is adjusted so that the wavelength at which the monitored value of the first optical receiver element 15 and the monitored value of the second optical receiver element 16 match each other coincides with the target wavelength. This wavelength adjustment is realizable, for example, by disposing a phase shifter, which uses a local heater, in a portion of the asymmetric MZ interferometer and adjusting an amount of current injected into the phase shifter.

FIG. 4B depicts a case where the laser wavelength shifts from the target wavelength toward longer wavelengths while the wavelength characteristics of the first periodic filter 11 and the second periodic filter 12 are adjusted as above and the temperature of the filter-integrated element 19 for the wavelength locker is maintained at the predetermined temperature. In such a case, the monitored value of the first optical receiver element 15 (MONITOR 1), that is, the transmittance value of the first periodic filter 11 increases, and the monitored value of the second optical receiver element 16 (MONITOR 2), that is, the transmittance value of the second periodic filter 12 decreases by the same amount as the increase for the first optical receiver element 15 or the first periodic filter 11. When the wavelength of the light source shifts, the difference between the monitored value of the first optical receiver element 15 and the monitored value of the second optical receiver element 16 changes and the sum of the monitored values of the two optical receiver elements are substantially fixed. FIG. 4C depicts a case where the temperature of the filter-integrated element 19 for the wavelength locker exceeds the predetermined temperature in addition to the condition in FIG. 4B. In such a case, the wavelength characteristic of the first periodic filter 11 shifts from the thick dotted line toward longer wavelengths, and the wavelength characteristic of the second periodic filter 12 shifts from the thin dotted line toward shorter wavelengths by the same amount as for the first periodic filter. As a result, the wavelength at which the transmittance value of the first periodic filter 11 and the transmittance value of the second periodic filter 12 match each other does not change and is maintained at the target wavelength. At the target wavelength, the monitored value of the first optical receiver element 15 and the monitored value of the second optical receiver element 16 decrease at the same rate. Thus, the case where the difference between the monitored value of the first optical receiver element 15 and the monitored value of the second optical receiver element 16 becomes zero when the filter temperature changes is realized under the condition that the wavelength of the light source coincides with the target wavelength. The wavelength of the light source is tuned accurately to the target wavelength irrespective of the temperature by controlling the wavelength of the light source so that the difference between the monitored value of the first optical receiver element 15 and the monitored value of the second optical receiver element 16 becomes zero.

If attention is focused on changes in the monitored values of the optical receiver elements with respect to the temperature, when the temperature changes, the sum of the monitored value of the first optical receiver element 15 and the monitored value of the second optical receiver element 16 does not substantially depend on a shift in the wavelength of the light source but changes considerably depending on a change in the temperature. This is because the effect of the wavelength shift on the monitored values of the two optical receiver elements is canceled out by calculating the sum of the monitored values. This cancellation is attributed to the opposite wavelength characteristics of the two periodic filters at around the target wavelength. Calculating the sum of the monitored values of the two optical receiver elements enables only an effect of the temperature variation to be mainly extracted even when the wavelength of the light source shifts from the target wavelength.

As described in the embodiment, the wavelength shift from the target wavelength and the shift in the filter temperature from the predetermined temperature are accurately monitored by a simple method by using the first periodic filter 11 and the second periodic filter 12 of the waveguide type that have opposite temperature characteristics and calculating the sum of or the difference between the monitored value of the first optical receiver element 15 and the monitored value of the second optical receiver element 16. A simple calculation using the monitored values compared with the related art enables accurate and mutually independent control of the wavelength of the light source and/or the temperature of the filter-integrated element 19 for the wavelength locker.

Figure 5A:
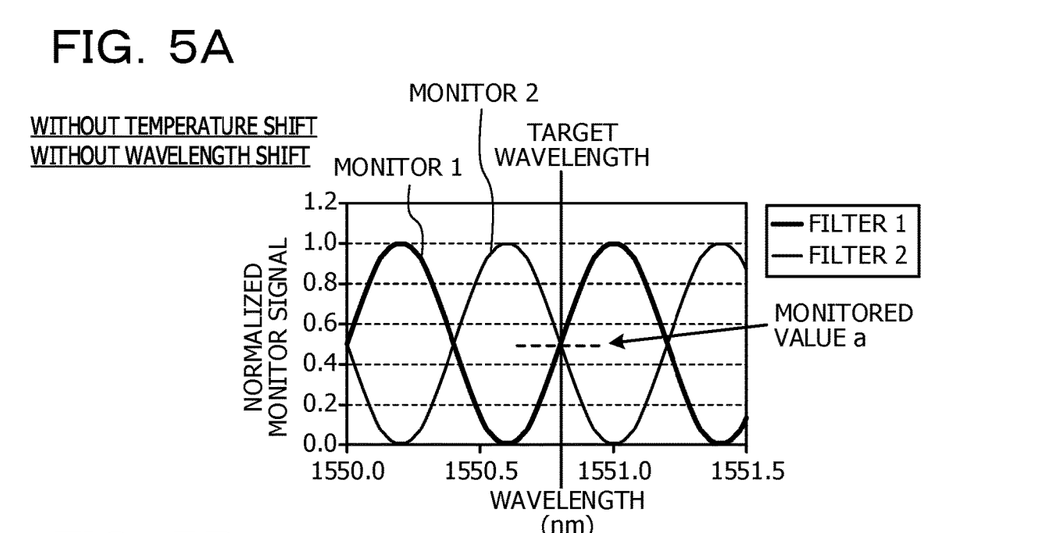
FIGS. 5A and 5B are graphs depicting example characteristics without a wavelength shift and with a temperature shift.
Figure 5B:
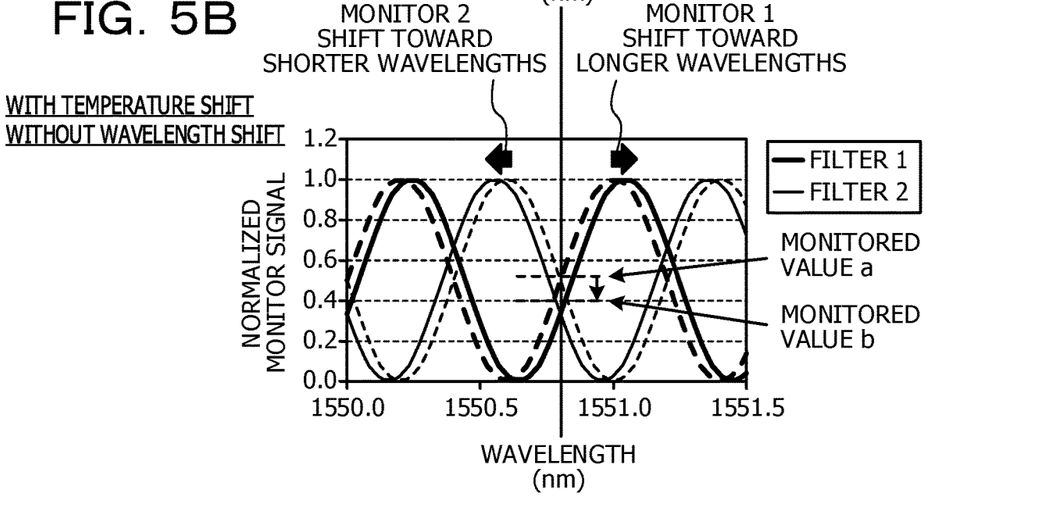

FIGS. 5A and 5B depict filter characteristics in a case where the wavelength of the light source coincides with the target wavelength and the filter temperature shifts from a predetermined temperature. FIG. 5A depicts a condition with no wavelength shift and no temperature shift in the same manner as in FIG. 4A. If attention is focused on changes in the monitored values of the optical receiver elements with respect to the temperature, when the temperature changes as depicted in FIG. 5B, both of the monitored value of the first optical receiver element 15 and the monitored value of the second optical receiver element 16 decrease (for example, decrease from the MONITORED VALUE a to the MONITORED VALUE b), and thus the temperature change is extracted by calculating the sum of the monitored values. In a case where the wavelength shift exists in addition to the temperature shift, calculating the sum of the monitored values enables the change in the monitored value of the first optical receiver element and the change in the monitored value of the second optical receiver element that are caused by the wavelength shift to cancel each other out. Thus, calculating the sum enables only an effect of the temperature variation to be mainly extracted even when the wavelength shift from the target wavelength exists.

Figure 6A:
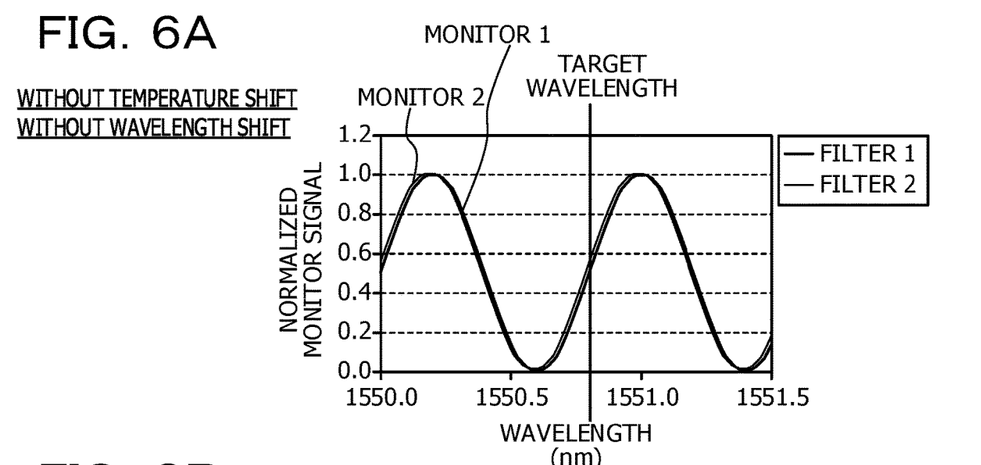
FIGS. 6A, 6B, and 6C are graphs depicting another example of wavelength characteristics and temperature characteristics of the waveguide-type filters according to the embodiment.
Figure 6B:
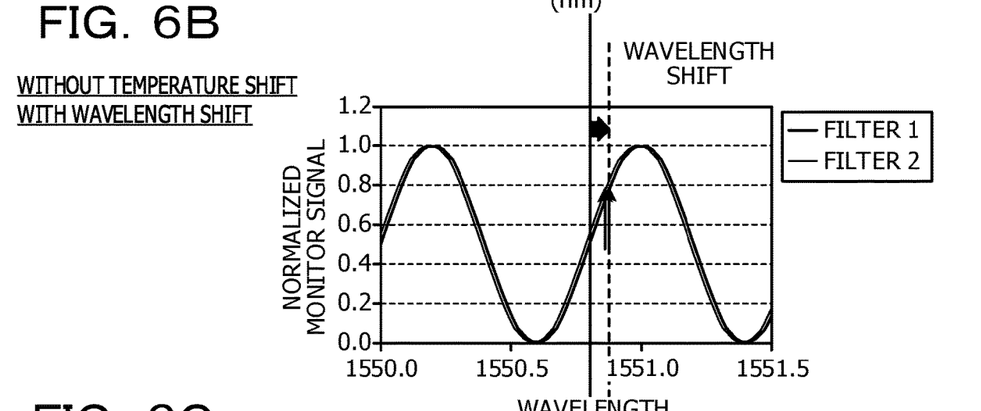
Figure 6C:
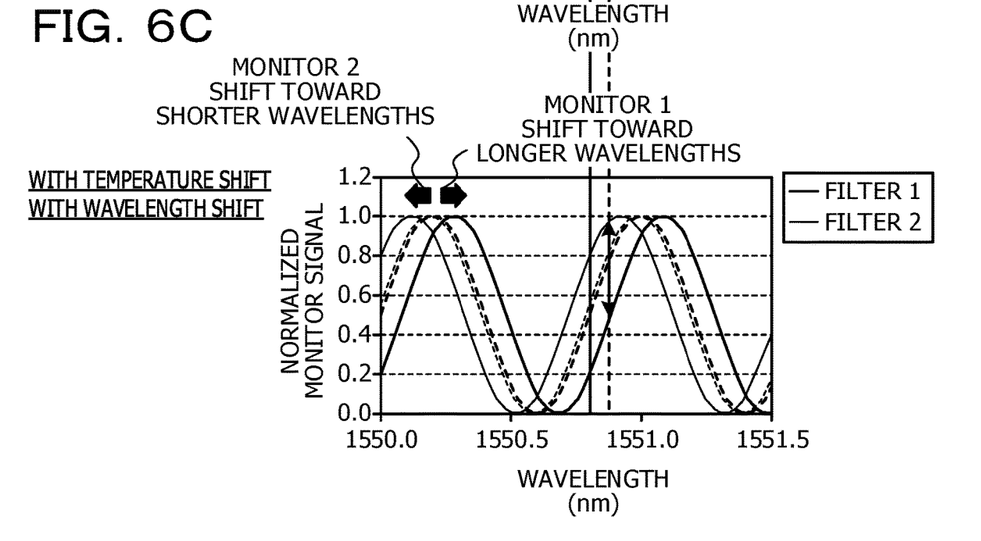

FIGS. 6A, 6B, and 6C depict another example of wavelength characteristics of the first periodic filter 11 and the second periodic filter 12, which are the waveguide-type filters according to the embodiment. In an example in FIG. 6A, the filter-integrated element 19 is adjusted so that, at a predetermined temperature, the wavelength characteristic of the first periodic filter 11 and the wavelength characteristic of the second periodic filter 12 coincide with each other, and the transmittance value at the target wavelength is 50%. In the same manner as in FIGS. 4A, 4B, and 4C, a monitored value of the first optical receiver element 15 and a monitored value of the second optical receiver element 16 correspond to a transmittance value of the first periodic filter 11 and a transmittance value of the second periodic filter 12, respectively. At a predetermined temperature, a change in the monitored value of the first periodic filter 11 and a change in the monitored value of the second periodic filter 12 with respect to the wavelength match each other.

Referring to FIG. 6B, if the wavelength of the light source shifts while the filter-integrated element 19 for the wavelength locker is maintained at the predetermined temperature, the transmittance value of the first periodic filter 11 and the transmittance value of the second periodic filter 12 deviate from 50% in accordance with the wavelength shift, leading to a change in the monitored value of the first optical receiver element 15 and a change in the monitored value of the second optical receiver element 16. Thus, if the wavelength of the light source is controlled so that both of the monitored value of the first optical receiver element 15 and the monitored value of the second optical receiver element 16 are maintained at a value corresponding to a transmittance value of 50%, it is possible to control the wavelength of the light source (laser) by a method similar to a method used for a wavelength locker in the related art. At the "predetermined temperature" described above, the wavelength characteristic of the first periodic filter 11 and the wavelength characteristic of the second periodic filter 12 match each other, and thus the difference between the monitored values is zero irrespective of the wavelength shift.

FIG. 6C depicts a case where a temperature shift occurs in addition to the condition in FIG. 6B. In such a case, the wavelength characteristic of the first periodic filter 11 shifts toward longer wavelengths, and the wavelength characteristic of the second periodic filter 12 shifts toward shorter wavelengths. As a result, the wavelength characteristic of the first periodic filter 11 and the wavelength characteristic of the second periodic filter 12 do not match each other. At the target wavelength, the monitored value of the first optical receiver element 15 decreases and the monitored value of the second optical receiver element 16 increases. The monitored value of the first optical receiver element and the monitored value of the second optical receiver element 16 change in opposite directions. Thus, if the sum is calculated, the monitored values cancel each other out, and the sum is maintained at an approximately fixed value irrespective of whether a temperature shift exists. Accordingly, irrespective of the temperature, if the sum of the two monitored values are calculated and the wavelength of the light source (laser) is controlled so that the average of the monitored values is maintained at a value corresponding to a target transmittance value (a transmittance value of 50% in this example), it is possible to tune the wavelength of the light source to a target wavelength.

When the temperature of the filter-integrated element 19 for the wavelength locker changes, the wavelength characteristic of the first periodic filter 11 and the wavelength characteristic of the second periodic filter 12 do not match each other. Thus, if the difference between the monitored values is calculated, it is possible to monitor the temperature shift.

Figure 7A:
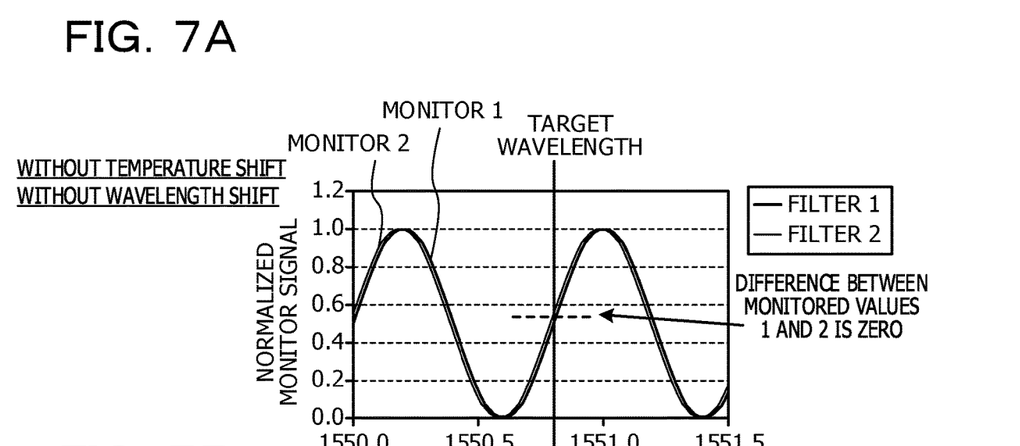
FIGS. 7A and 7B are graphs depicting example characteristics without a wavelength shift and with a temperature shift.
Figure 7B:
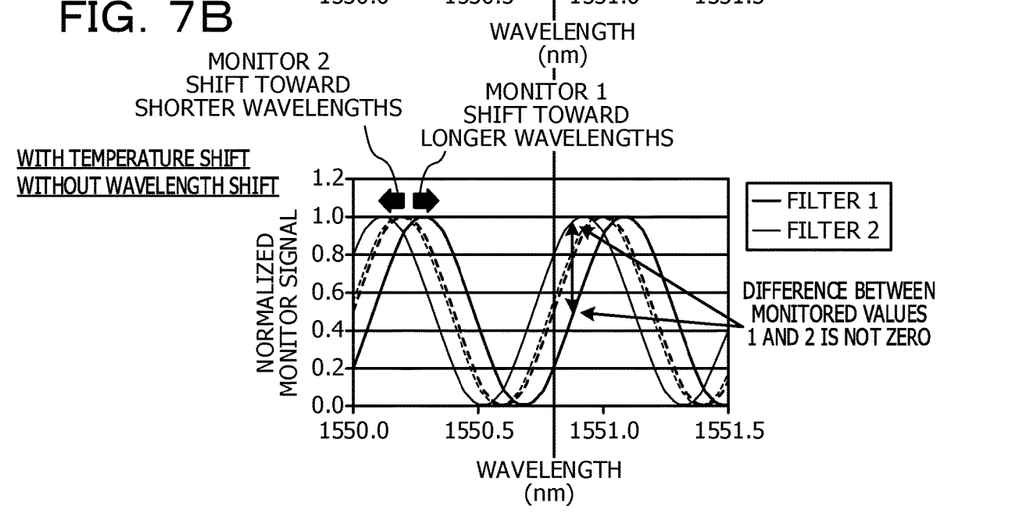

FIGS. 7A and 7B depict filter characteristics in a case where the wavelength of the light source coincides with the target wavelength and the filter temperature shifts from a predetermined temperature. FIG. 7A depicts a condition with no wavelength shift and no temperature shift in the same manner as in FIG. 6A. In such a case, the difference between the two monitored values is zero. When the temperature of the filter-integrated element 19 for the wavelength locker changes as depicted in FIG. 7B, the wavelength characteristic of the first periodic filter 11 and the wavelength characteristic of the second periodic filter 12 of the waveguide-type do not match each other. One of the monitored values increases and the other of the monitored values decreases. Thus, if the difference between the monitored values is calculated, it is possible to monitor the temperature shift. If the temperature is controlled so that the difference between the monitored values is zero, it is possible to adjust the temperature of the filter-integrated element 19 for the wavelength locker at a desired value.

The first periodic filter 11 and the second periodic filter 12 may be designed to have the same wavelength characteristic (FIGS. 6A, 6B, 6C, 7A, and 7B) or may be designed to have wavelength characteristics with opposite gradients with respect to the wavelength (FIGS. 4A, 4B, 4C, 5A, and 5B) on the assumption that the wavelength characteristics shift in opposite wavelength directions with respect to a temperature change. The calculation using the monitored values is different in each of the two cases above.

In the examples in FIGS. 4A, 4B, 4C, 5A, and 5B, the wavelength shift is detected by using the difference between the two monitored values, and the temperature shift is detected by using the sum of the two monitored values. In the examples in FIGS. 6A, 6B, 6C, 7A, and 7B, the wavelength shift is detected by using the sum of the two monitored values, and the temperature shift is detected by using the difference between the two monitored values. In every example in FIGS. 4A, 4B, 4C, 5A, 5B, 6A, 6B, 6C, 7A, and 7B, by simply calculating the sum of and the difference between the monitored value of the first optical receiver element 15 and the monitored value of the second optical receiver element 16, it is possible to monitor accurately the wavelength shift from the target wavelength and the temperature shift from the predetermined temperature. A simple calculation using the monitored values compared with a configuration in the related art enables accurate and mutually independent control of the wavelength of the light source and the temperature of the filter-integrated element 19.

In every example in FIGS. 4A, 4B, 4C, 5A, 5B, 6A, 6B, 6C, 7A, and 7B, the wavelength characteristic of the first periodic filter 11 and the wavelength characteristic of the second periodic filter 12 shift in opposite wavelength directions by the same amount with respect to a temperature change. The amounts of shift that are not exactly the same in opposite wavelength directions are also sufficiently effective. The reason is that an effect of the temperature change of the wavelength locker on a shift in the lasing wavelength is reduced compared with a wavelength locker in the related art because the shift of the wavelength characteristic of the first periodic filter 11 and the shift of the wavelength characteristic of the second periodic filter 12 with respect to a temperature change tend to cancel each other out at all times.

Modification

Figure 8:
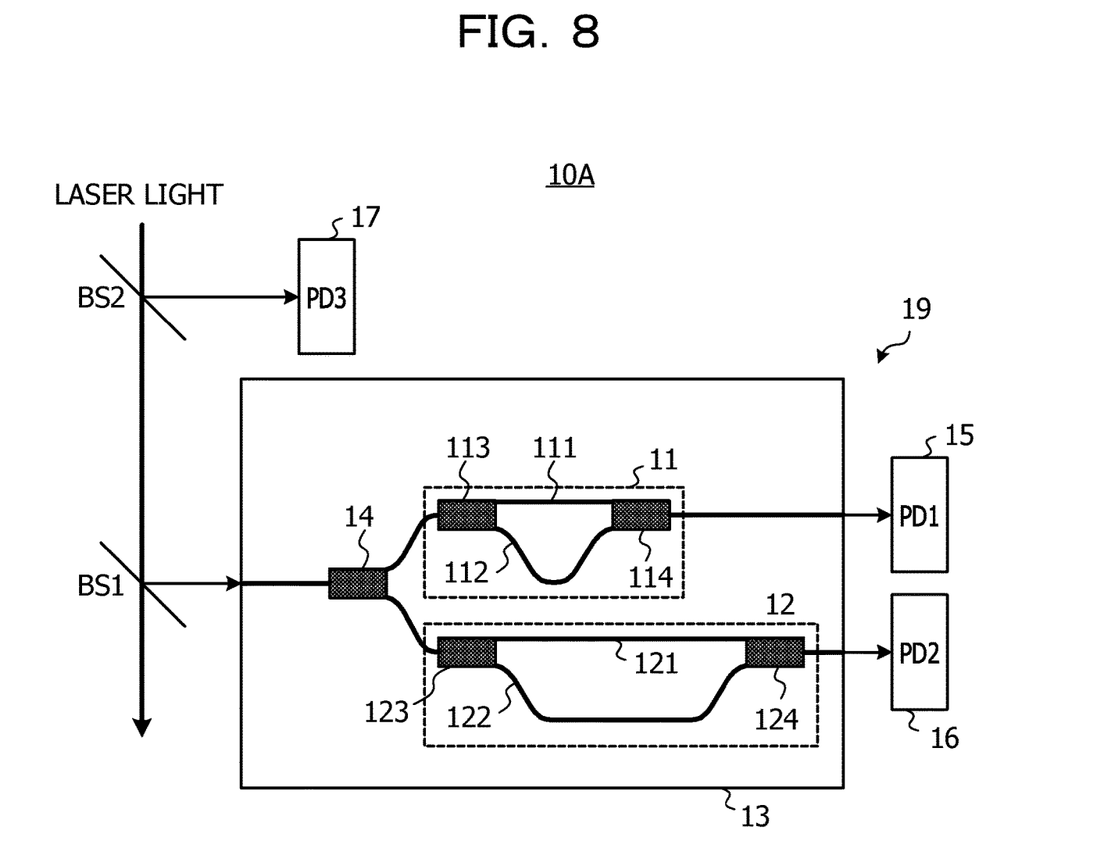
FIG. 8 is a schematic diagram of a wavelength locker according to a modification.

FIG. 8 is a schematic diagram of a wavelength locker 10A according to a modification. The wavelength locker 10A includes a third optical receiver element 17 (PD3) and a beam splitter (BS2) to split the laser light to the third optical receiver element 17 in addition to the configuration of the wavelength locker 10 in FIG. 1. The same elements as in FIG. 1 are denoted by the same reference numerals and are not repeatedly described herein. The third optical receiver element 17 detects a light intensity directly proportional to the output light from the light source without using a filter or the like that has wavelength dependence.

By using the monitored value of the third optical receiver element 17, it is possible to normalize the monitored value of the first optical receiver element 15, which detects the transmitted light passing through the first periodic filter 11, and the monitored value of the second optical receiver element 16, which detects the transmitted light passing through the second periodic filter 12. Consequently, a stable monitored value is obtained even if the output intensity of the laser fluctuates, and thus wavelength control is stabilized. Also in the modification, the first periodic filter 11 and the second periodic filter 12 of the waveguide type are designed so that the wavelength characteristics shift in opposite wavelength directions when the temperature changes. According to the modification, an effect of the wavelength shift of the light source due to a temperature change is reduced, and it is possible to accurately detect the wavelength shift from the target wavelength and the temperature shift from the predetermined temperature.

Wavelength Tunable Laser Apparatus

Figure 9:
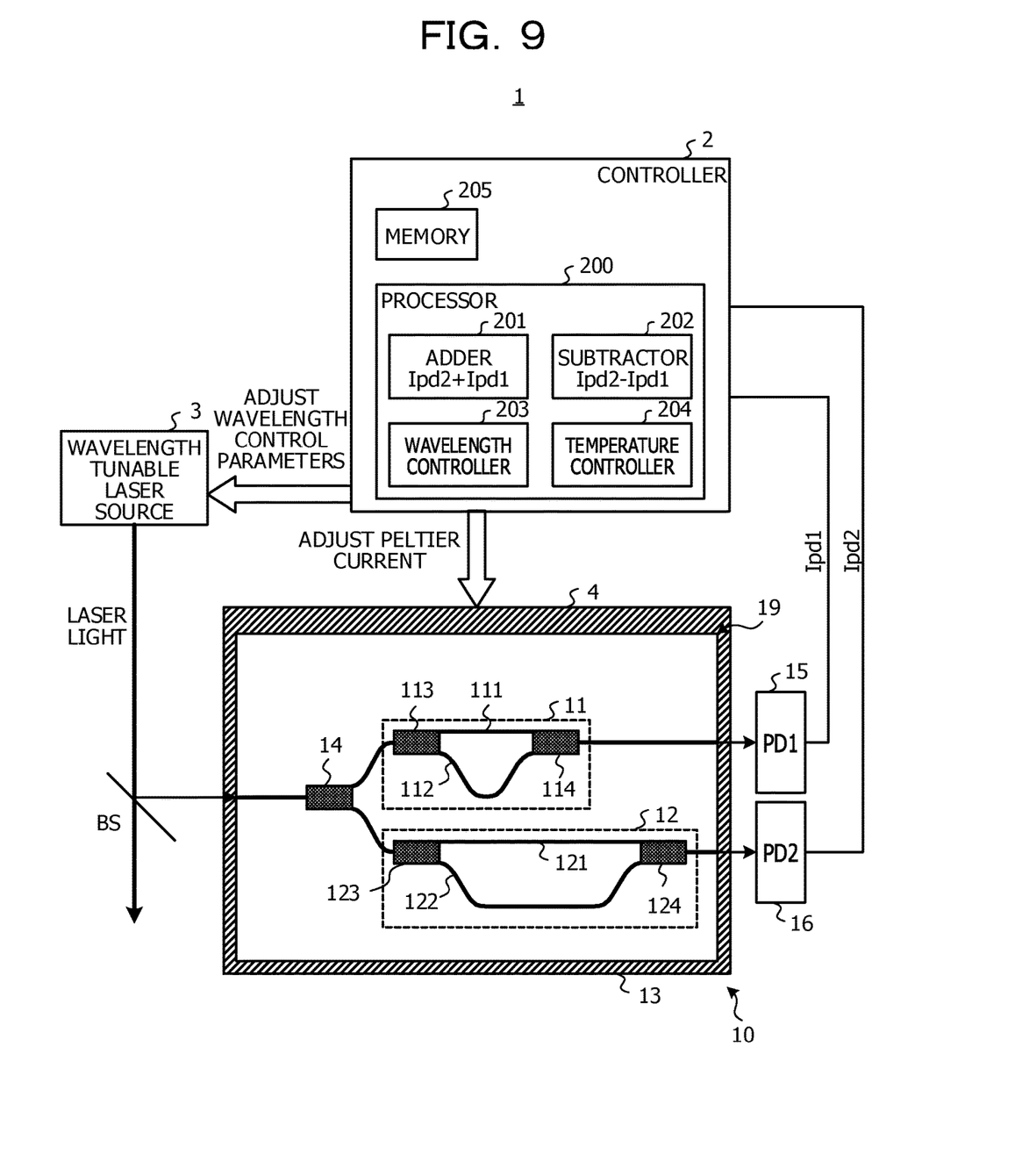
FIG. 9 is a diagram depicting an example configuration of a wavelength tunable laser apparatus including the wavelength locker.

FIG. 9 is a schematic diagram of a wavelength tunable laser apparatus 1 according to the embodiment. The wavelength tunable laser apparatus 1 includes a wavelength tunable laser source 3, the wavelength locker 10, and a controller 2. Main part of the wavelength locker 10 is formed as the filter-integrated element 19, which is disposed on a Peltier element 4 for temperature control. The output of the first optical receiver element 15 and the output of the second optical receiver element 16 in the wavelength locker 10 are connected to the inputs of the controller 2.

The controller 2 controls the wavelength of the wavelength tunable laser source 3 and the temperature of the Peltier element 4, that is, the temperature of the first periodic filter 11 and the second periodic filter 12 in accordance with the monitored value of the first optical receiver element 15 and the monitored value of the second optical receiver element 16. The controller 2 includes a processor 200 and a memory 205, and the processor 200 performs calculation using a working area in the memory 205.

The processor 200 includes an adder 201, a subtractor 202, a wavelength controller 203, and a temperature controller 204. The adder 201 calculates the sum of the monitored value of the first optical receiver element 15 and the monitored value of the second optical receiver element 16. The subtractor 202 calculates the difference between the monitored value of the first optical receiver element 15 and the monitored value of the second optical receiver element 16. The wavelength controller 203 adjusts wavelength control parameters for the wavelength tunable laser source 3 in accordance with the output from the adder 201 and the output from the subtractor 202 and tunes the wavelength of the light source to a target wavelength. When a temperature shift is detected, the temperature controller 204 controls the amount of current injected into the Peltier element 4 so as to maintain the temperature of the filter-integrated element 19 at a predetermined temperature. The control parameters for the wavelength tunable laser source 3 and the control parameters for the Peltier element 4 are stored in the memory 205.

If the wavelength characteristic of the first periodic filter 11 and the wavelength characteristic of the second periodic filter 12 are designed to have gradients with opposite signs with respect to the wavelength as depicted in FIGS. 4A and 5A, the wavelength controller 203 controls the wavelength of the wavelength tunable laser source 3 so that the difference between the monitored values, which is output from the subtractor 202, approaches zero. Thus, the wavelength of the wavelength tunable laser source 3 is tuned to the target wavelength. The temperature controller 204 controls the amount of current injected into the Peltier element 4 to adjust the temperature of the filter-Integrated element 19 so that the sum of the monitored values, which is output from the adder 201, coincides with a predetermined value.

If the wavelength characteristic of the first periodic filter 11 and the wavelength characteristic of the second periodic filter 12 are designed to have the same characteristic as depicted in FIGS. 6A, 6B, 6C, 7A, and 7B, the wavelength controller 203 controls the wavelength of the wavelength tunable laser source 3 so that the sum of the monitored values, which is output from the adder 201, coincides with a predetermined value. Thus, the wavelength of the wavelength tunable laser source 3 is tuned to the target wavelength. The temperature controller 204 controls the amount of current injected into the Peltier element 4 to adjust the temperature of the filter-integrated element 19 so that the difference between the monitored values, which is output from the subtractor 202, approaches zero.

The temperature control of the filter-integrated element 19 (or the Peltier element 4) is optional. The wavelength locker 10 according to the embodiment is designed to cancel out a shift of the wavelength characteristic due to a temperature change at all times, and thus it is possible to tune the wavelength of the wavelength tunable laser source 3 to a target wavelength even if the temperature fluctuates to some extent. Controlling the temperature of the filter-integrated element 19 enables the lasing wavelength of the light source to be more precisely tuned.

The embodiment is described as above based on a particular example, which is intended to be a non-limiting example. For example, although the description is given of the example in which a 2×1 coupler is used as the optical couplers 114 and 124 disposed on the output sides of the periodic filters of the waveguide type constituted by the asymmetric MZ interferometers, a 90-degree hybrid waveguide may be used instead of the 2×1 coupler, which is a structure disclosed in the literature in the related art, such as Japanese Laid-open Patent Publication No. 2015-6854. A rectangular prism mirror may be used instead of a beam splitter. The first optical receiver element 15 and the second optical receiver element 16 may be disposed on the Peltier element 4 along with the filter-integrated element 19. The wavelength locker 10A in FIG. 8 may be used instead of the wavelength locker 10 in FIG. 9. In each of the first periodic filter 11 and the second periodic filter 12, the optical path length difference ΔL0 between the two waveguides is not limited to 3 mm but is appropriately selected in accordance with a frequency band or a grid interval that is selected. Also in such a case, the common optical path length Loom is determined so that the wavelength characteristics shift in opposite wavelength directions with respect to a temperature change for the two periodic filters.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wavelength locker, comprising:
   a splitter configured to split a portion of light that is output from a light source into a first monitoring light and a second monitoring light;
   a first periodic filter configured to receive the first monitoring light;
   a second periodic filter configured to receive the second monitoring light;
   a first optical receiver configured to monitor an intensity of light that has passed through the first periodic filter; and
   a second optical receiver configured to monitor an intensity of light that has passed through the second periodic filter,
   wherein the first periodic filter and the second periodic fitter each has a wavelength characteristic in which an intensity of transmitted light changes periodically with respect to a wavelength, and the wavelength characteristic of the first periodic filter and the wavelength characteristic of the second periodic filter shift in opposite wavelength directions when temperature changes.

2. The wavelength locker according to claim 1, wherein the first periodic filter and the second periodic filter are each constituted by an asymmetric Mach-Zehnder interferometer.

3. The wavelength locker according to claim 2, wherein the first periodic filter includes a first waveguide and a second waveguide that is longer than the first waveguide, the second periodic filter includes a third waveguide and a fourth waveguide that is longer than the third waveguide, an optical path length difference between the first waveguide and the second waveguide is equal to an optical path length difference between the third waveguide and the fourth waveguide, and an optical path length of the first waveguide is different from an optical path length of the third waveguide.

4. The wavelength locker according to claim 3, wherein the second waveguide is longer than the first waveguide, a width of the second waveguide is narrower than a width of the first waveguide, the fourth waveguide is longer than the third waveguide, and a width of the fourth waveguide is narrower than a width of the third waveguide.

5. The wavelength locker according to claim 1, wherein, at a target wavelength, a gradient of a monitored value of the first optical receiver with respect to the wavelength and a gradient of a monitored value of the second optical receiver with respect to the wavelength have opposite signs, and the monitored value of the first optical receiver is equal to the monitored value of the second optical receiver.

6. The wavelength locker according to claim 1, wherein, at a target wavelength, a gradient of a monitored value of the first optical receiver with respect to the wavelength is equal to a gradient of a monitored value of the second optical receiver with respect to the wavelength.

7. A wavelength tunable laser apparatus, comprising:
a laser light source;
a wavelength locker configured to receive a portion of light that is output from the laser light source; and
a processor configured to tune a wavelength of the laser light source to a target wavelength in accordance with an output from the wavelength locker,
wherein the wavelength locker includes:
a splitter configured to split the portion of the light that is output from the laser light source into a first monitoring light and a second monitoring light;
a first periodic filter configured to receive the first monitoring light;
a second periodic filter configured to receive the second monitoring light;
a first optical receiver configured to monitor an intensity of light that has passed through the first periodic filter; and
a second optical receiver configured to monitor an intensity of light that has passed through the second periodic filter,
wherein the first periodic filter and the second periodic filter each has a wavelength characteristic in which an intensity of transmitted light changes periodically with respect to a wavelength, and the wavelength characteristic of the first periodic filter and the wavelength characteristic of the second periodic filter shift in opposite wavelength directions when temperature changes.

8. The wavelength tunable laser apparatus according to claim 7,
wherein, at a target wavelength, a gradient of a monitored value of the first optical receiver with respect to the wavelength and a gradient of a monitored value of the second optical receiver with respect to the wavelength have opposite signs, and the monitored value of the first optical receiver is equal to the monitored value of the second optical receiver, and
the processor is configured to
tune the wavelength of the laser light source so that a difference between the monitored value of the first optical receiver and the monitored value of the second optical receiver approaches zero.

9. The wavelength tunable laser apparatus according to claim 7,
wherein, at a target wavelength, a gradient of a monitored value of the first optical receiver with respect to the wavelength is equal to a gradient of a monitored value of the second optical receiver with respect to the wavelength, and
the processor is configured to
tune the wavelength of the laser light source so that a sum of the monitored value of the first optical receiver and the monitored value of the second optical receiver coincides with a predetermined value.

10. A method for controlling a wavelength tunable laser apparatus including a wavelength locker, the method comprising:
monitoring transmitted light that is output from a first periodic filter and transmitted light that is output from a second periodic filter, each of the first periodic filter and the second periodic filter being disposed in the wavelength locker and having a wavelength characteristic in which an intensity of transmitted light changes periodically with respect to a wavelength and a temperature characteristic in which the wavelength characteristic of the first periodic filter and the wavelength characteristic of the second periodic filter shift in opposite wavelength directions when temperature changes, and
tuning a wavelength of a light source to a target wavelength by using a sum of or a difference between a first monitored value of the transmitted light that is output from the first periodic filter and a second monitored value of the transmitted light that is output from the second periodic filter.

11. The method for controlling the wavelength tunable laser apparatus according to claim 10, wherein the monitoring includes:
receiving the transmitted light that is output from the first periodic filter by using a first optical receiver;
obtaining the first monitored value by measuring a light intensity of the transmitted light that is output from the first periodic filter by using the first optical receiver;
receiving the transmitted light that is output from the second periodic filter by using a second optical receiver; and obtaining the second monitored value by measuring a light intensity of the transmitted light that is output from the second periodic filter by using the second optical receiver.

* * * * *